United States Patent
Chan et al.

(10) Patent No.: US 7,368,995 B2
(45) Date of Patent: May 6, 2008

(54) POWER AMPLIFIER WITH ACTIVE BIAS CIRCUIT

(75) Inventors: Yi-Jen Chan, Taoyuan County (TW); Meng-Wei Hsieh, Taoyuan County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 10/708,371

(22) Filed: Feb. 26, 2004

(65) Prior Publication Data

US 2005/0083128 A1     Apr. 21, 2005

(30) Foreign Application Priority Data

Oct. 16, 2003   (TW) ............... 92128662 A

(51) Int. Cl.
*H03G 3/10* (2006.01)
(52) U.S. Cl. ............ 330/285; 330/275; 330/277
(58) Field of Classification Search ........... 330/285, 330/261, 196, 296, 286, 290, 277
See application file for complete search history.

(56) References Cited

U.S. PATENT DOCUMENTS

| | | | |
|---|---|---|---|
| 5,363,058 A * | 11/1994 | Sasaki ............... 330/136 |
| 5,374,899 A * | 12/1994 | Griffiths et al. ............ 330/277 |
| 5,532,646 A * | 7/1996 | Aihara .................. 330/279 |
| 5,724,004 A * | 3/1998 | Reif et al. ............... 330/277 |
| 5,751,181 A * | 5/1998 | Maemura et al. ........... 327/434 |
| 5,789,983 A * | 8/1998 | Fujita ................ 330/277 |
| 5,808,515 A * | 9/1998 | Tsuruoka et al. .......... 330/277 |
| 5,949,287 A * | 9/1999 | Kurusu et al. ............ 330/277 |
| 5,982,236 A * | 11/1999 | Ishikawa et al. .......... 330/296 |
| 6,166,604 A * | 12/2000 | Matsunaga ............... 330/277 |
| 6,304,130 B1* | 10/2001 | Poulin et al. ............ 327/430 |
| 6,759,906 B2* | 7/2004 | Matsunaga et al. ........ 330/285 |
| 2004/0095193 A1* | 5/2004 | Krvavac ................. 330/285 |
| 2004/0232989 A1* | 11/2004 | Eo et al. .................. 330/285 |

* cited by examiner

*Primary Examiner*—Linh Nguyen
(74) *Attorney, Agent, or Firm*—Jianq Chyun IP Office

(57) ABSTRACT

A power amplifier with an active bias circuit and operating method thereof are provided. The power amplifier comprises a power amplifier transistor and an active bias circuit. The active circuit receives input power and applies a bias voltage to the gate of the power amplifier transistor. The bias voltage will increase in correspondence with an increase in the input power. Therefore, the power amplifier of this invention has excellent output power, linearity of operation and power-added efficiency in a range of input power.

17 Claims, 5 Drawing Sheets

POWER AMPLIFIER WITH ACTIVE BIAS CIRCUIT

CROSS-REFERENCE TO RELATED APPLICATION

This application claims the priority benefit of Taiwan application serial no. 92128662, filed on Oct. 16, 2003.

BACKGROUND OF THE INVENTION

1. Field of the Invention

The present invention relates to a power amplifier. More particularly, the present invention relates to a power amplifier with an active bias circuit for improving power-added efficiency (PAE).

2. Description of Related Art

A power amplifier (PA) is an important device in microwave circuits. For example, a power amplifier is used to amplify the broadcast signals at the transmission (TX) terminal of a radio frequency circuit. With the popularity of portable communication systems, a maximum output power and output power efficiency have become critical factors for the development of the wireless transmission.

The output efficiency of the power amplifier is represented by the output power and the output power efficiency. Typically, the maximum output power is the most important factor in output power while a power gain and power-added efficiency (PAE) are the two most important factors in output power efficiency. The power gain of the amplifier is defined as a ratio of the output power to an input power. In other words, a larger power gain implies a higher amplifying capacity for the power amplifier. The power-added efficiency is an ability that the power amplifier converts a direct current (DC) input power into an alternating current (AC) output power. In fact, power-added efficiency is defined as the ratio of the direct current (DC) input power to the alternating current (AC) output power, or PAE=(AC output power−DC input power)/DC input power. Similarly, the higher the power-added efficiency, the better the power amplifier is. FIG. 1 is a graph showing the relationship of the output power, the power gain and the power-added efficiency versus the input power of a conventional power amplifier. As shown in FIG. 1, most power amplifiers have excellent output power linearity when the input power is small. However, when the input power is large, the output power is no longer linearly amplified and results in a drop in the gain. This drop in the gain is known as a gain compression. The quality of the power amplifier can be assessed according to the input power at which the gain compression is generated because a later generation of the gain compression means that the power amplifier has better output linearity and maintains a distortion free signal output for a larger input power range.

FIG. 2 is a circuit diagram of a conventional semiconductor transistor power amplifier. As shown in FIG. 2, the transistor 202 serves as a power amplifier transistor and may be such as a CMOS transistor. In FIG. 2, $V_g$ is the gate bias voltage for the transistor 202; $P_{in}$ is the input power; $P_{out}$ is the output power. In a conventional CMOS power amplifier, a class-A bias design is often adopted. In the class-A bias design, the transistor 202 is biased at a half of the saturation voltage $V_{sat}$ thereof so that a full wave transmission of signal is still possible at a larger output power level. Hence, the power amplifier can have a higher output power and a higher power gain as well as a distortion free linear operating region. However, a disadvantage is that most A-class power amplifiers are designed to use a single constant gate bias voltage (for example, the gate bias voltage $V_g$ of the transistor 202 is still at half $V_{dd}$). Since output power is equal to a product of voltage and current, power consumption is only reduced by a little at a low output power when the current flow is small and hence leads to an undesirable waste of DC power.

Therefore, in order to increase output the power efficiency of the power amplifier, the power amplifier sometimes operates in a class-AB or class-B operating region. In other words, the gate bias voltage $V_g$ of the transistor 202 in FIG. 2 is lowered. Thus, the power-added efficiency (PAE) of the power amplifier is increased. However, the signal waveform is constrained by the gate bias voltage when the output power is large so that the maximum output power and linearity of the power amplifier are reduced.

Hence, enhancing the power-added efficiency and lower direct current power consumption of the power amplifier without reducing the maximum output power and linearity of operation of the device is important and required.

SUMMARY OF THE INVENTION

Accordingly, at least one objective of the present invention is to provide a power amplifier with an active bias circuit capable of increasing the power-added efficiency of the amplifier so that a direct current (DC) power consumption is reduced without reducing a maximum output power or decreasing linearity of the output power.

To achieve these and other advantages and in accordance with the purpose of the invention, as embodied and broadly described herein, the invention provides a power amplifier with an active bias circuit. The power amplifier includes a power amplifier transistor and the active bias circuit. The power amplifier transistor has the gate connected to a gate bias voltage. The active bias circuit is connected to an input power terminal and the gate of the power amplifier transistor for receiving an input power from the input power terminal and applying a bias voltage to the gate of the power amplifier transistor. Hence, the gate bias voltage will increase in accordance with an increase of the input power.

In the aforementioned power amplifier, the curve of an increase of the gate bias voltage versus the input power is either a linear curve or a non-linear curve.

Preferably, the power amplifier transistor and the active bias circuit is manufactured by a system on chip (SOC) process.

Preferably, the active bias circuit of the aforementioned power amplifier includes a diode and a resistor, and an equivalent resistance of the diode varies corresponding to the input power.

This invention also provides an integrated circuit for a power amplifier with an active bias circuit. The integrated circuit includes a power output device, a power amplifier transistor, an active bias circuit and a power input device. The power amplifier transistor has a gate connected to a gate bias voltage. The active bias circuit is connected to the power output device and the gate of the power amplifier transistor for receiving input power from the power output device and applying a bias voltage to the gate of the power amplifier transistor. Hence, the gate bias voltage will increase in accordance with an increase of the input power. The power input device is connected to an output terminal of the power amplifier transistor for receiving the amplified output from the power amplifier transistor.

In the aforementioned integrated circuit, the curve of the increase of the gate bias voltage versus the input power is either a linear curve or a non-linear curve.

Preferably, the power amplifier transistor and the active bias circuit is manufactured by a system on chip (SOC) process.

Preferably, the active bias circuit of the aforementioned integrated circuit includes a diode and a resistor, and the equivalent resistance of the diode varies corresponding to the input power.

This invention also provides a method of providing a gate bias voltage to a transistor power amplifier according to the input power. The method includes providing an input power and then outputting a gate bias voltage corresponding to the input power wherein the gate bias voltage is increased in accordance with the input power.

In the aforementioned method, the curve of the increase of the gate bias voltage versus the input power is either a linear curve or a non-linear curve.

Accordingly, the power amplifier of the invention can provide a lower gate bias voltage (close to the operating range of a conventional class-AB or class B power amplifier) when the input power is low, and a higher gate bias voltage (close to the operating range of a conventional class-A power amplifier) when the input power is high. Therefore, the power amplifier of this invention has a high output power and linearity of operation as well as a high power-added efficiency regardless of whether the input power is low or high.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
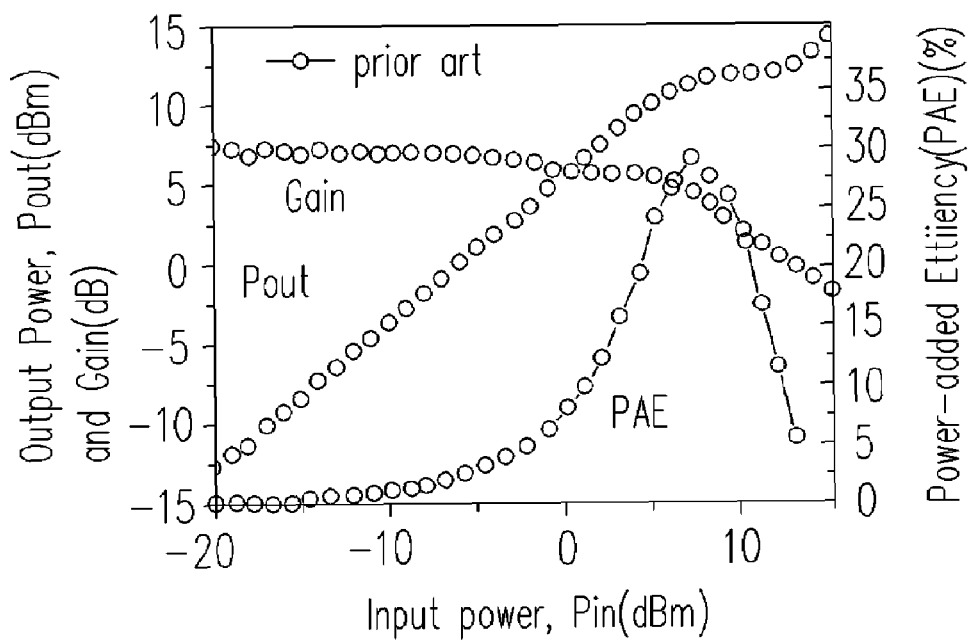
FIG. 1 is a graph showing the relationships of output power, power gain and power-added efficiency versus input power of a conventional power amplifier.
Figure 2:
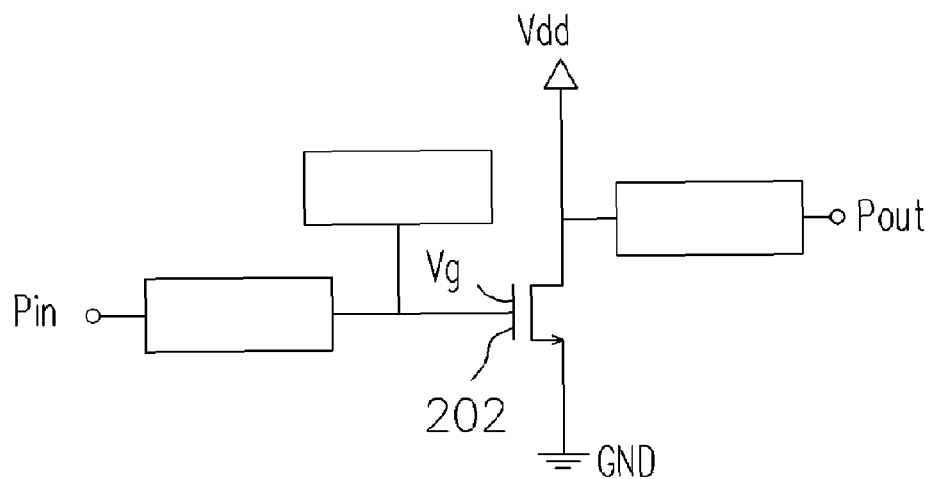
FIG. 2 is a circuit diagram of a conventional semiconductor transistor power amplifier.

Reference will now be made in detail to the present embodiments of the invention, examples of which are illustrated in the accompanying drawings. Wherever possible, the same reference numbers are used in the drawings and the description to refer to the same or like elements.

Figure 3:
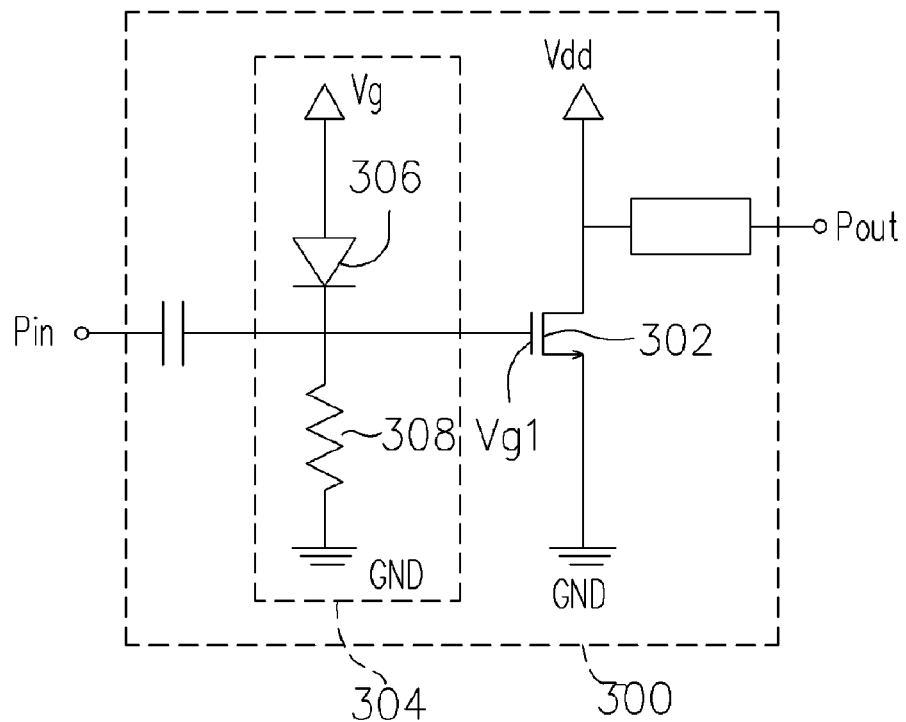
FIG. 3 is a circuit diagram of a power amplifier with an active bias circuit according to one embodiment of this invention.
Figure 4:
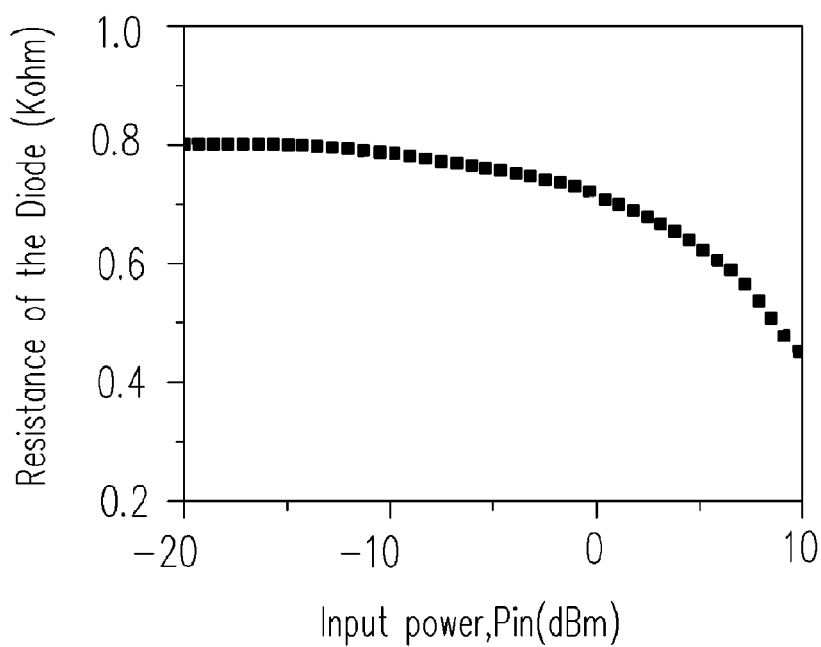
FIG. 4 is a graph showing the relationship of the equivalent resistance versus the input power of a diode.

FIG. 3 is a circuit diagram of a power amplifier with an active bias circuit according to one embodiment of this invention. As shown in FIG. 3, the power amplifier 300 comprises a transistor 302 and an active bias circuit 304. The transistor 302 serves as a power amplifier transistor such as a CMOS transistor. $V_{g1}$ is a gate bias voltage applied to the transistor 302. $P_{in}$ is an input power and $P_{out}$ is an output power. The active bias circuit 304 further comprises a diode 306 and a resistor 308. FIG. 4 is a graph showing the relationship of an equivalent resistance versus the input power of the diode. As shown in FIG. 4, when a signal with a definite power passes through a parallel connected diode, the equivalent resistance of the diode will decrease with an increase in the signal power regardless of whether the diode is set in forward or reverse bias. Hence, if the input power $P_{in}$ of the active bias circuit 304 in FIG. 3 is low, the active bias circuit 304 is equivalent to a voltage divider constructed by a forward bias diode and a serially connected and grounded resistor with high resistance. Thus, by adjusting the resistance of the resistor, the transistor 302 can be operated at a lower gate bias voltage $V_{g1}$ (that is, the gate bias voltage $V_{g1}$ is in the conventional class-AB or class-B operating range). In other words, when the input power $P_{in}$ is low, the power amplifier 300 with the active bias circuit is able to provide a higher power-added efficiency (PAE) so that the DC power consumption is reduced.

On the other hand, when the input power $P_{in}$ in FIG. 3 is increased, the equivalent resistance of the diode 306 is reduced so that the voltage across the resistor 308 is increased. Consequently, with an increase of the input power $P_{in}$, the gate bias voltage $V_{g1}$ applied to the transistor 302 is also increased (that is, the gate bias voltage $V_{g1}$ is in the conventional class-A operating range). In other words, the power amplifier 300 with the active bias circuit is able to provide a higher output power and an excellent linearity of the output power similar to a conventional class-A power amplifier.

Figure 5:
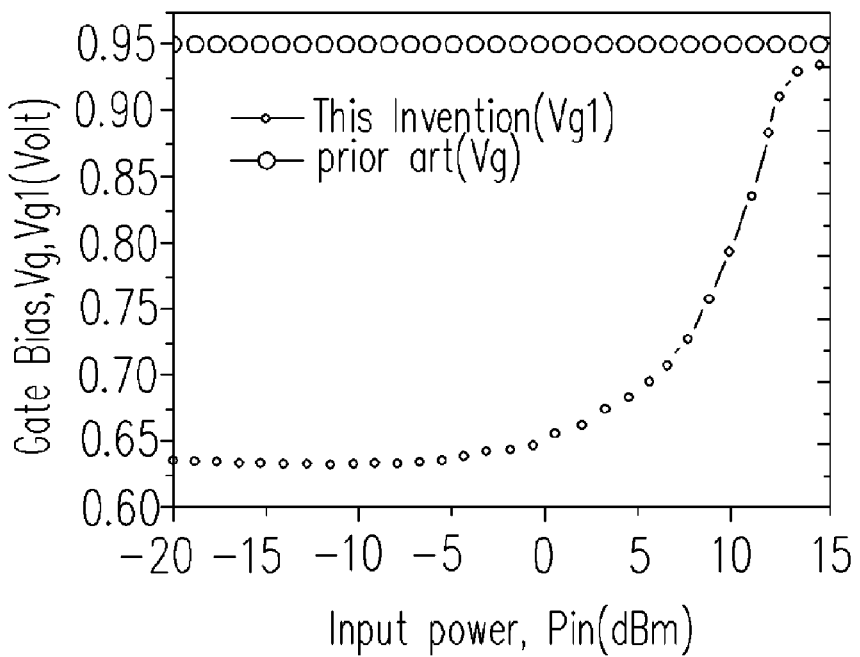
FIG. 5 is a graph showing the relationship of the gate bias voltage versus the input power for a power amplifier with active bias circuit of the invention and a conventional A-class power amplifier.

FIG. 5 is a graph showing the relationship of the gate bias voltage $V_{g1}$ applied to the transistor 302 of the power amplifier 300 in FIG. 3 and the gate bias voltage $V_g$ applied to the transistor of a conventional A-class power amplifier versus the input power. As shown in FIG. 5, the conventional A-class power amplifier always has an almost constant gate bias voltage value regardless of whether the input power is high or low. In the power amplifier of this invention, the gate bias voltage value is low when the input power is low and the gate bias voltage value is high when the input power is high.

Figure 6:
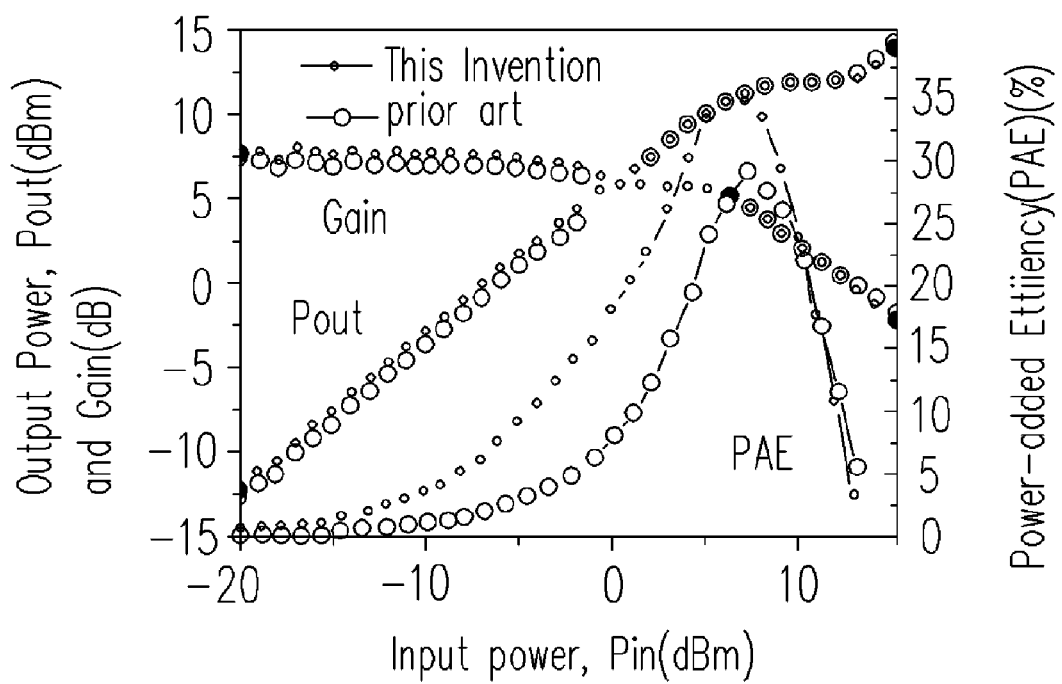
FIG. 6 is a graph showing the relationships of output power, power gain and power-added efficiency versus input power for a power amplifier with active bias circuit according to this invention and the similar relationships of a conventional class-A power amplifier.

FIG. 6 is a graph showing the relationship of the output power, power gain and power-added efficiency versus the input power for the power amplifier with the active bias circuit according to this invention and the similar relationships of a conventional class-A power amplifier. As shown in FIG. 6, the power amplifier according to this invention has a higher power-added efficiency than a conventional class-A power amplifier since as shown in FIG. 5, the gate bias voltage of a conventional A-class power amplifier is almost constant and the gate bias voltage of the power amplifier of this invention is dependent on the input power. Thus, when the input power is low, the power amplifier has a low gate bias voltage (close to the operating range of a conventional class-AB or a class-B amplifier). Conversely, when the input power is high, the power amplifier has a high gate bias voltage (close to the operating range of a conventional class-A amplifier). In other words, the power amplifier of this invention is able to provide both high output power and excellent linearity as a conventional class-A amplifier and to provide a high power-added efficiency as a conventional class-AB or class-B amplifier.

Figure 7:
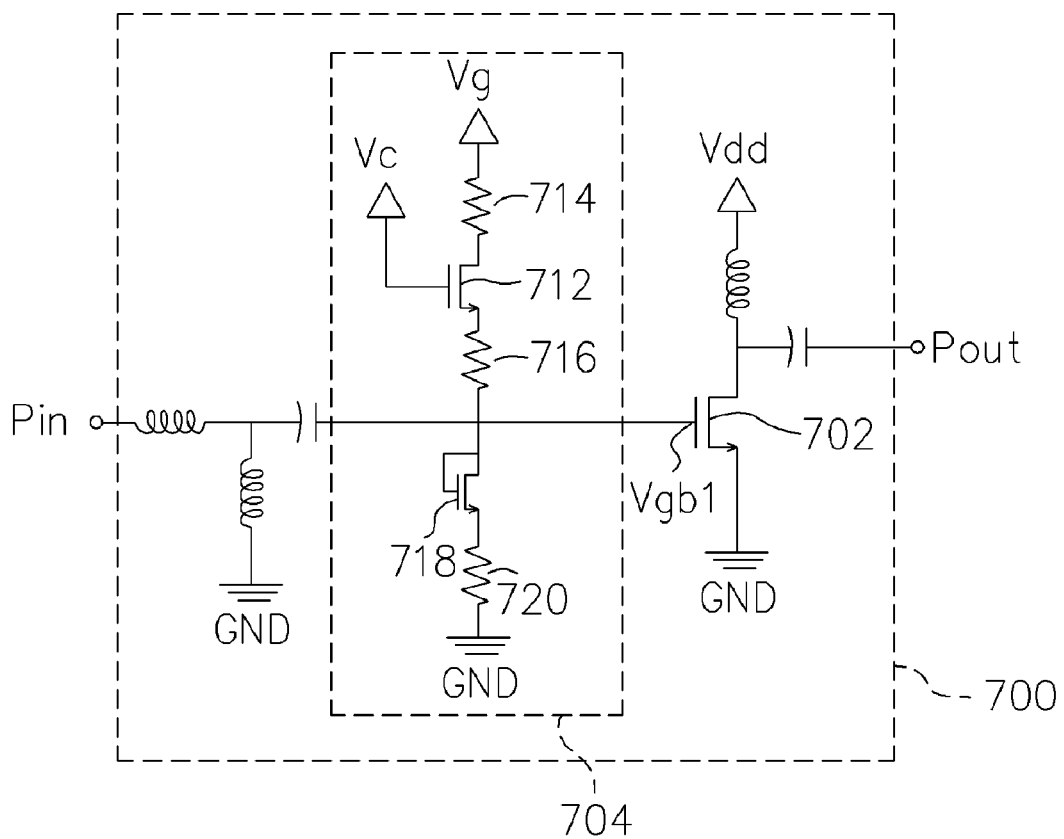
FIG. 7 is a circuit diagram of a CMOS power amplifier with an active bias circuit according to one embodiment of this invention.

FIG. 7 is a circuit diagram of a CMOS power amplifier with an active bias circuit according to one embodiment of this invention. As shown in FIG. 7, the CMOS power amplifier 700 comprises a transistor 702, an active bias circuit 704 and other circuits including inductors and capacitors for impedance matching. The transistor 702 is a major component serving as a power-amplifying transistor in the power amplifier 700. The active bias circuit 704 is a circuit for providing the transistor 702 with a gate bias voltage $V_{gb1}$. The inductors and capacitors together form an impedance matching network.

Inside the active bias circuit 704, a transistor 712 functions as a diode and resistors 714, 716 serve to adjust the gate bias voltage and set the basic level of the gate bias voltage curve as well as provide a cutter for high frequency signals. A depletion transistor 718 functions as a diode and connects serially with a resistor 720. Although the equivalent resistance of the transistor 718 will vary corresponding to the power of the signal, however, the overall effect of the transistor 718 and the resistor 720 is to adjust the basic level of the gate bias voltage because the resistance of the resistor 720 is substantially higher than those of the resistor 714 and 716.

Figure 8:
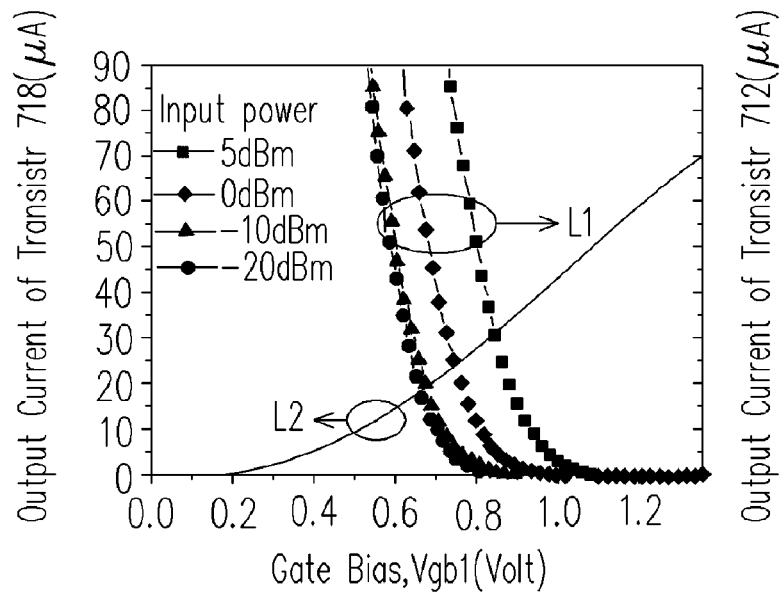
FIG. 8 is a graph showing the relationship of the output current versus the gate bias voltage of the two transistor circuits inside the active bias circuit according to one embodiment of this invention.

FIG. 8 is a graph showing the relationship of the output current versus the gate bias voltage for two transistor circuits inside the active bias circuit shown in FIG. 7. As shown in FIG. 8, the curves of the output current for the transistor 712 versus the gate bias voltage $V_{gb1}$ is represented by a plurality of curves L1 with a scale labeled on the right vertical axis. Similarly, the curve of the output current for the transistor 718 versus the gate bias voltage $V_{gb1}$ is represented by a curve 12 with a scale labeled on the left vertical axis. In FIG. 8, the L1 curves show the output current of the gate bias voltage $V_{gb1}$ for four different input power levels (e.g., input power of −20 dBm, −10 dBm, 0 dBm and 5 dBm respectively). It is noted that the gate bias voltage $V_{gb1}$ increases with an increase of the input power. Furthermore, the gate bias voltage $V_{gb1}$ of the cross points of the left curve L2 and the right curves L1 is the gate bias voltage $V_{gb1}$ applied to the power-amplifying transistor 702. Therefore, the gate bias voltage $V_{gb1}$ applied to the transistor 702 increases when the input power is increased.

Figure 9:
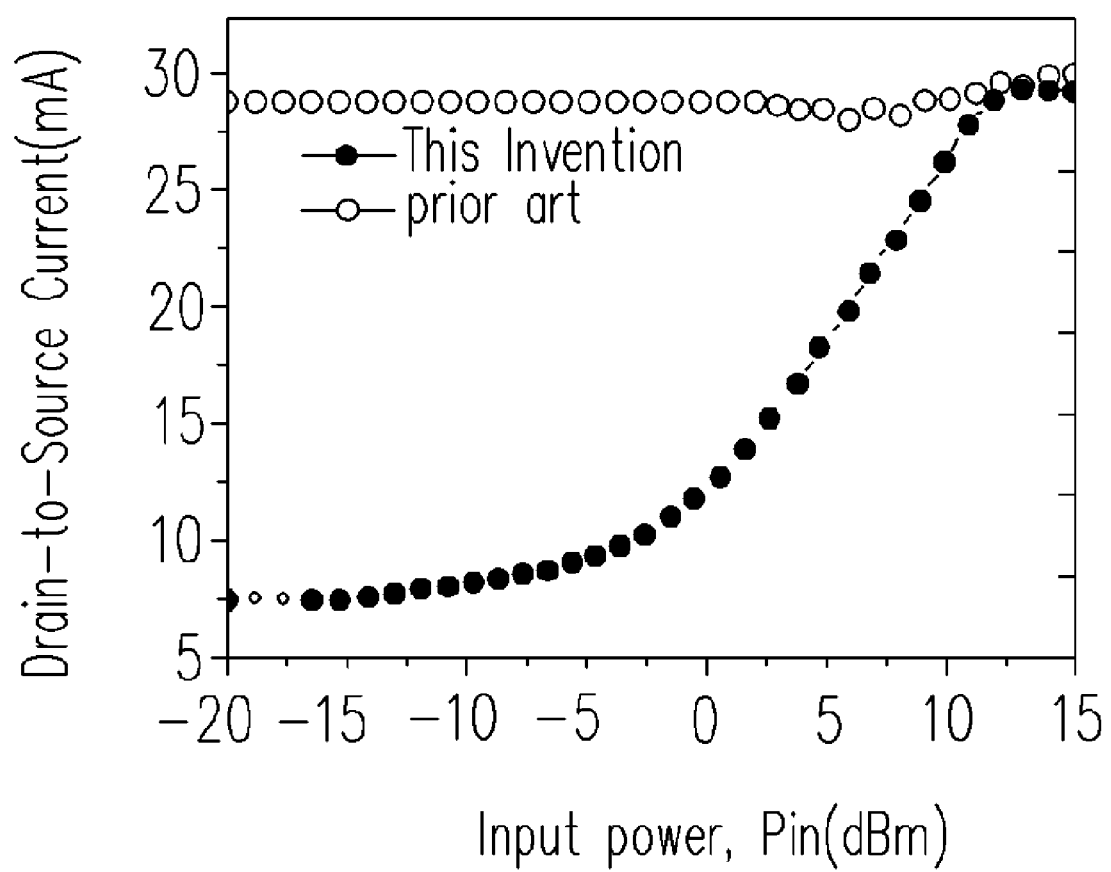
FIG. 9 is a graph showing the relationship of the drain-to-source current versus the input power of a power amplifier with an active bias circuit according to this invention and a conventional A-class power amplifier.

FIG. 9 is a graph showing the relationship of a drain-to-source current versus the input power for a power amplifier with an active bias circuit according to this invention and a conventional A-class power amplifier. A conventional A-class power amplifier always has an almost constant gate bias voltage regardless of whether the input power is high or low. Therefore, the effect of input power on the drain-to-source current is minimal. In the power amplifier of this invention, the gate bias voltage is low when the input power is low so that the drain-to-source current is small. Conversely, the gate bias voltage is high when the input power is high so that the drain-to-source current is large. Since power is equal to the product of current and voltage, the power amplifier of this invention has a small DC power consumption and a relatively high power-added efficiency due to a small voltage and current when the input power is low. On the other hand, the power amplifier has a current and voltage similar to a conventional class-A amplifier when the input power is high, therefore, a higher output power and excellent linearity are achieved.

In another embodiment of this invention, the power amplifier and the active bias circuit may be manufactured by using a system on chip (SOC) process. In an SOC product, the electrical isolations between either active devices or passive devices are very important. Thus, the inductors and transistors are disposed within a deeper N-type doped area to prevent any mutual signal interference.

Accordingly, the power amplifier of the invention can provides a lower gate bias voltage (close to the operating range of a conventional class-AB or class B power amplifier) when the input power is low, and a higher gate bias voltage (close to the operating range of a conventional class-A power amplifier) when the input power is high. Therefore, the power amplifier of this invention has a high output power and linearity of operation as well as a high power-added efficiency regardless of whether the input power is low or high.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power amplifier with an active bias circuit, comprising:
   a power amplifier transistor with a gate connected to a gate bias voltage; and
   an active bias circuit serially connected between an input power terminal of the power amplifier and the gate of the power amplifier transistor for receiving an input power from the input power terminal and outputting the gate bias voltage to the gate, wherein the gate bias voltage is increased corresponding to an increase of the input power, wherein the active bias circuit comprises a voltage source other than the input power.

2. The power amplifier of claim 1, wherein a curve of an increase of the gate bias voltage versus the input power is a linear curve.

3. The power amplifier of claim 1, wherein a curve of an increase of the gate bias voltage versus the input power is a non-linear curve.

4. The power amplifier of claim 1, wherein the power amplifier transistor and the active bias circuit is manufactured by a system on chip (SOC) process.

5. The power amplifier of claim 1, where the active bias circuit comprises a diode and a resistor.

6. The power amplifier of claim 5, wherein an equivalent resistance of the diode in the active bias circuit varies in correspondence with the input power.

7. An integrated circuit for a power amplifier with an active bias circuit, comprising:
   a power output device, from which a power is received for the power amplifier operation;

a power amplifier transistor with a gate connected to a gate bias voltage;

an active bias circuit serially connected between the power output device and the gate of the power amplifier transistor for receiving an input power from the power output device and providing a gate bias voltage to the gate, wherein the gate bias voltage is increased corresponding to an increase of the input power, wherein the active bias circuit comprises a voltage source other than the input power; and a power input device connected to an output terminal of the power amplifier transistor for receiving an amplified output power from the power amplifier transistor.

8. The integrated circuit of claim 7, wherein a curve of an increase of the gate bias voltage versus the input power is a linear curve.

9. The integrated circuit of claim 7, wherein a curve of an increase of the gate bias voltage versus the input power is a non-linear curve.

10. The integrated circuit of claim 7, wherein the power amplifier transistor and the active bias circuit is manufactured by a system on chip (SOC) process.

11. The integrated circuit of claim 7, wherein the power amplifier transistor and the active bias circuit is manufactured by a system on chip (SOC) process.

12. The integrated circuit of claim 11, wherein the equivalent resistance of the diode in the active bias circuit varies in correspondence with the input power.

13. A method for generating a gate bias voltage of a power amplified transistor corresponding to an input power, comprising:

providing an input power to an active bias circuit disposed before the power amplified transistor; and outputting a gate bias voltage corresponding to the input power, wherein the gate bias voltage is powered by a voltage source other than the input power and increased corresponding to an increase of the input power, wherein the input power is transmitted along a path constituting of a first terminal from which the input power is inputted, the active bias circuit, the power amplified transistor, a terminal from which the gate bias voltage is outputted in that sequence.

14. The method of claim 13, wherein a curve of an increase of the gate bias voltage versus the input power is a linear curve.

15. The method of claim 13, wherein a curve of an increases of the gate bias voltage versus the input power is a non-linear curve.

16. The power amplifier of claim 1, wherein the active bias circuit comprises a grounded level.

17. The method of claim 7, wherein the active bias circuit comprises a grounded level.

* * * * *